(12) United States Patent
Burnham et al.

(10) Patent No.: US 8,124,505 B1
(45) Date of Patent: Feb. 28, 2012

(54) TWO STAGE PLASMA ETCHING METHOD FOR ENHANCEMENT MODE GAN HFET

(75) Inventors: Shawn D Burnham, Oxnard, CA (US);
Karim S. Boutros, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/909,497

(22) Filed: Oct. 21, 2010

(51) Int. Cl.
H01L 21/20 (2006.01)
H01L 21/36 (2006.01)
H01L 31/20 (2006.01)

(52) U.S. Cl. ............. 438/483; 438/172; 257/E21.407; 257/E21.45

(58) Field of Classification Search .............. 438/483
See application file for complete search history.

(56) References Cited

U.S. PATENT DOCUMENTS

| 7,555,219 | B2 | 6/2009 | Cox | |
| 2006/0060871 | A1* | 3/2006 | Beach | 257/94 |

FOREIGN PATENT DOCUMENTS

WO    WO 2007/062589    6/2007

OTHER PUBLICATIONS

Buttari et al. "Digital Etching for High Reproducible low Damage Gate Recessing on AlGaN/GaN HEMTs" Proc. IEEE Lester Eastman Conf. Aug. 6-8, 2002, pp. 461-469.*

Okamoto et al. "179 W recessed-gate AlGaN/GaN heterojunction FET with field-modulating plate" Electronics Letters, May 13, 2004, vol. 40, No. 10.*

O. Ambacher, et al., "Two-dimensional electron gases induced by spontaneous and piezoelectric polarization charges in N- and Ga-face AlGaN/GaN heterostructures", Journal of Applied Physics, Mar. 1999, vol. 85, No. 6, p. 3222-3233.

M. Asif Khan, et al., "Enhancement and depletion mode GaN/AlGaN heterostructure field effect transistors", Applied Physics Letters, Jan. 1996, vol. 68, No. 4, p. 514-516.

Yong Cai, et al., "High-Performance Enhancement-Mode AlGaN/GaN HEMTs Using Fluoride-Based Plasma Treatment", IEEE Electron Device Letters, Jul. 2005, vol. 26, No. 7, p. 435-437.

Jeong S. Moon, et al., "Submicron Enhancement-mode AlGaN/GaN HEMTs", Device Research Conference, 2002. 60th DRC. Conference Digest, p. 23-24.

Audunn Ludviksson, et al., "Atomic layer etching chemistry of Cl2 on GaAs(100)", Surface Science, 1992, vol. 277, p. 282-300.

(Continued)

Primary Examiner — Ha Tran T Nguyen
Assistant Examiner — Shaka Scarlett
(74) Attorney, Agent, or Firm — George R. Rapacki; Daniel R. Allemeier

(57) ABSTRACT

A two stage plasma etching technique is described that allows the fabrication of an enhancement mode GaN HFET/HEMT. A gate recess area is formed in the Aluminum Gallium Nitride barrier layer of an GaN HFET/HEMT. The gate recess is formed by a two stage etching process. The first stage of the technique uses oxygen to oxidize the surface of the Aluminum Gallium Nitride barrier layer below the gate. Then the second stage uses Boron trichloride to remove the oxidized layer. The result is a self limiting etch process that uniformly thins the Aluminum Gallium Nitride layer below the HFET's gate region such that the two dimensional electron gas is not formed below the gate, thus creating an enhancement mode HFET.

10 Claims, 13 Drawing Sheets

OTHER PUBLICATIONS

D. Buttari, et al., "Digital Etching for Highly Reproducible Low Damage Gate Recessing on AlGaN/GaN HEMTs", Proceedings. IEEE Lester Eastman Conference, High Performance Devices, 2002, p. 461-469.

D. Buttari, et al., "Origin of etch delay time in Cl2 dry etching of AlGaN/GaN structures", Applied Physics Letters, Dec. 2003, vol. 83, No. 23, p. 4779-4781.

Gregory C. Desalvo, et al., "Wet Chemical Digital Etching of GaAs at Room Temperature", Journal of the Electrochemical Society, 1996, vol. 143, No. 11, p. 3652-3656.

H. Maher, et al., "Smooth wet etching by ultraviolet-assisted photoetching and its application to the fabrication of AlGaN/GaN heterostructure field-effect transistors", Applied Physics Letters, Dec. 2000, vol. 77, No. 23, p. 3833-3835.

G. Parish, et al., "Simple Wet Etching of GaN", Proceedings of SPIE, Device and Process Technologies for MEMS and Microelectronics II, 2001, vol. 4592, p. 104-110.

D. Buttari, et al., "Selective Dry Etching of GaN Over AlGaN in BCL3/SF6 Mixtures", Proceedings. IEEE Lester Eastman Conference, High Performance Devices, Aug. 2004, p. 132-137.

W.B. Lanford, et al., "Recessed-gate enhancement-mode GaN HEMT with high threshold voltage", Electronics Letters, Mar. 2005, vol. 41, No. 7, p. 449-450.

David Keogh, et al., "Digital Etching of III-N Materials Using a Two-Step Ar/KOH Technique", Journal of Electronic Materials, 2006, vol. 35, No. 4, p. 771-776.

Shawn D. Burnham, et al., "Gate-recessed normally-off GaN-on-Si HEMT using a new O2-BCl3 digital etching technique", Physica Status Solidi C, (ICNS-8), 2010, vol. 7, No. 7-8, p. 2010-2012.

* cited by examiner

TWO STAGE PLASMA ETCHING METHOD FOR ENHANCEMENT MODE GAN HFET

FIELD OF THE INVENTION

The present invention relates to the area of fabrication of enhancement mode Gallium Nitride (GaN) Heterogeneous Field Effect Transistors (HFETS) or High Electron Mobility Transitors (HEMTs). In particular a method is described of fabricating a normally off device by selectively suppressing the formation of the two dimensional electronic gas (2DEG) below the gate area by thinning an Aluminum Gallium Nitride (AlGaN) barrier layer with a two stage plasma etching process such that the conduction band of the material structure is greater than the Fermi energy.

BACKGROUND OF THE INVENTION

This invention involves a two-step etch process that can be used to sequentially remove layers of material. This digital etching technique is particularly useful for the fabrication of semiconductor devices that require the ability to very accurately remove a few nanometers of material. One particular application is the conversion of AlGaN/GaN HFET/HEMT devices from depletion mode (normally-on operation) to enhancement mode (normally-off operation). Because of the polarization effects at the AlGaN—GaN interface, a 2DEG is formed at the interface [1], which creates a conduction path for normally-on, or depletion-mode (D-mode) devices, as shown in FIG. 1. FIG. 1 shows device 100 comprising a D-mode AlGaN/GaN HFET structure, with continuous 2DEG 126 between the source 150 and drain 170 contacts. The device 100 comprises a buffer layer 130, a GaN channel layer 120 and an AlGaN barrier layer 110. The device 100 in FIG. 1 further comprises a source 150, drain 170, gate 160 and passivation material 180, which may be SiN. The vertical energy band diagram of the device is also shown on the right, with the charge density plot below showing the concentration of the electrons 11 in the 2DEG 126 along the length of the 2DEG 126. The upper diagram on the right is the band energy diagram showing the conduction band 13, valence band 12 and Fermi level 14.

Depletion mode devices use a negatively biased gate on top of the AlGaN barrier layer to deplete the 2DEG of charge, and thus turn off the device. These devices are called "normally-on" because under no gate bias, there is a conduction path between the source and drain contacts. FIG. 1 shows the GaN channel layer of a depletion mode device, in contact with an approximately 200 angstrom AlGaN layer. The associated band diagram shows the Fermi energy level as function of depth of the AlGaN layer measured from the upper surface of the AlGaN layer and the corresponding charge density as a function of this depth. The charge density plot shows the presence of the 2DEG at the interface between the AlGaN and GaN layers. Note at this depth, the Conduction band dips below the Fermi energy level.

A "normally-off" device would have negligible conduction between the source and drain under no gate bias. A normally-off device would be useful for power applications for increased safety and lower power consumption. GaN enhancement mode (E-Mode) HFETs/HEMTs have been fabricated by (a) growing a thinner AlGaN barrier layer [2], (b) implanting fluorine into the barrier under the gate [3], and (c) etching the barrier layer under the gate [4]. The numbers in square brackets refer to the references that follow.

By growing a thinner AlGaN barrier layer 210, as shown in FIG. 2, the conduction band of the energy band diagram is shifted higher than the Fermi energy so that the 2DEG 226 does not exist, making the device normally-off. However, the drawback to this approach is that the 2DEG 226 does not exist anywhere in the device, so there is no low-resistance, high-mobility conduction path between the source and drain. Furthermore, it is not practical to make a gate 260 long enough to span the entire source 250-drain 270 gap to modulate a channel 220.

By implanting fluorine ions into the AlGaN barrier under the gate, as shown in FIG. 3, the 2DEG is depleted under the gate near the fluorine ions, creating a break in the 2DEG channel between the source and drain. This break in the 2DEG channel results in a normally-off device, but because only the area under the gate is affected the gate is still able to modulate the channel by building up charge in that area and therefore turning the device on again. However this method suffers from a few drawbacks: (1) control of the fluorine dose is difficult, so repeatable fluorine treatment is an issue, (2) fluorine is usually implanted using a non-uniform low-power plasma hence the uniformity of the threshold voltage across a wafer is an issue when long gates are constructed, (3) the implant process inherently causes damage to the material, reducing performance, and (4) the stability of the implanted fluorine ions is unknown, so the reliability of the device is an issue.

The final method to create enhancement mode devices is to selectively remove the AlGaN barrier layer under the device gate, as shown in FIG. 4. This selective removal or "gate recess etch", thins the AlGaN barrier sufficiently to shift the conduction band higher than the Fermi energy, as with the thin-grown AlGaN barrier method, depleting the 2DEG in the etched area under the gate. However, unlike the thin-grown AlGaN barrier method, the 2DEG is only depleted under the gate and continues to exist everywhere else in the device. Therefore, the device is normally-off, but the gate is still able to modulate the channel. Gate recess etching is usually achieved with a plasma dry etching system, such as RIE (Reactive Ion Etching) or ICP (Inductively Coupled Plasma). However, problems with the traditional method of gate recess etching include (1) that the plasma is usually not very uniform resulting in non-uniform threshold voltages as with fluorine treatment, and (2) the etches are usually done at sufficiently high plasma powers to cause deep damage in the material that is not removed by the etching process.

SUMMARY OF THE INVENTION

The purpose of the digital etching technique described in this invention disclosure is to have better control and uniformity of etching compared to other etching methods. The technique is particularly useful for creating normally-off devices from normally-on HFETs. This method is better than thin-grown AlGaN barrier layers because it does not sacrifice the beneficial properties of the 2DEG across the entire wafer. This method is better than the fluorine-treatment method because it does not depend on implanted ions in the barrier below the gate that may be unstable. Since it does not implant ions it results in less lattice damage, and it is semi-self limiting so it is more uniform. It is better than standard gate recess etching because it uses a semi-self-limiting etching process and therefore results in more uniform etching.

Use of this digital etching technique will have wide-spread application due to the improved control and uniformity it allows. However, it is particularly applicable for power electronics for car, aircraft and solar power manufacturers. Finally, as solar power becomes more prominent, efficient power distribution networks will also benefit from power electronics made using this digital etching technique.

GaN enhancement mode HFETs/HEMTs have been fabricated by (a) growing a thinner AlGaN barrier layer [2], (b) implanting fluorine into the barrier under the gate [3], and (c) etching the barrier layer under the gate [4]. By growing a thinner AlGaN barrier layer, as shown in FIG. 2, the conduction band of the energy band diagram is shifted higher than the Fermi energy so that the 2DEG does not exist, making the device normally-off. However, the drawback to this approach is that the 2DEG does not exist anywhere in the device, so all of the advantages of high-speed and high-power GaN HFETs do not exist either. Furthermore, it is not practical to make a gate long enough to span the entire source-drain gap to modulate a channel. By implanting fluorine ions into the AlGaN barrier under the gate, as shown in FIG. 3, the 2DEG is depleted under the gate near the fluorine ions, creating a break in the 2DEG channel between the source and drain. This break in the 2DEG channel results in a normally-off device, but because only the area under the gate is affected the gate is still able to modulate the channel by building up charge in that area and therefore turning the device on again. However this method suffers from a few drawbacks: (1) control of the fluorine dose is difficult, so repeatable fluorine treatment is an issue, (2) fluorine is usually implanted using a non-uniform low-power plasma in a dry-etching system, so the uniformity of threshold voltage across a wafer is an issue, (3) the implant process inherently causes damage to the material, reducing performance, and (4) the stability of the implanted fluorine ions is unknown, so the reliability of the device is an issue. The final method to create enhancement mode devices is to selectively etch away the AlGaN barrier layer under the device gate, as shown in FIG. 4. This selective gate etch, or "gate recess etch", thins the AlGaN barrier sufficiently to shift the conduction band higher than the Fermi energy, as with the thin-grown AlGaN barrier method, thus depleting the 2DEG in the etched area under the gate. However, unlike the thin-grown AlGaN barrier method, the 2DEG is only depleted under the gate and continues to exist everywhere else in the device. Therefore, the device is normally-off, but the gate is still able to modulate the channel. Gate recess etching is usually achieved with a plasma dry etching system, such as RIE or ICP. However, problems with the traditional method of gate recess etching include (1) that the plasma is usually not very uniform resulting in non-uniform threshold voltages as with fluorine treatment, and (2) the etches are usually done at sufficiently high plasma powers to cause deep damage in the material that is not removed by the etching process. There are a few established methods for digital etching for GaAs [5], but very little work has been done for GaN. A digital etching technique has been presented that uses a dry plasma step and a wet etch step to remove 5-6 Angstroms per step [6], but the drawback of this technique is that it could take more than 6 hours to remove 100 Angstroms for a dry-wet processing step that took 20 minutes per cycle.

These problems and others are overcome by using a two step plasma etching process to thin the AlGaN layer where the Gate is formed. In the first step the AlGaN is oxidized with an $O_2$ plasma. In the second step, the Gate area in the AlGaN is etched with a Boron trichloride plasma. Since the oxidation of the AlGaN/GaN is self limiting in that only the top layer of the AlGaN/GaN is oxidized and the Boron trichloride etches the oxide layer at a faster rate than the non-oxidized AlGaN/GaN, the result is a self limiting etching of the AlGaN/GaN layer. By repeating cycles of $O_2$ and $BCl_3$ the AlGaN/GaN may be etched in a very controlled manner one or a few atomic layers at a time. Furthermore, since moderate powers and gas flow rates are used, the etching does not introduce deep damage to the surface of the AlGaN. The thickness of the oxide layer in the AlGaN/GaN material depends on the plasma power used to oxidize the material.

BRIEF DESCRIPTION OF THE DRAWINGS

The accompanying drawings, together with the specification, illustrate exemplary embodiments of the present invention, and, together with the description, serve to explain the principles of the present invention.

Figure 1:
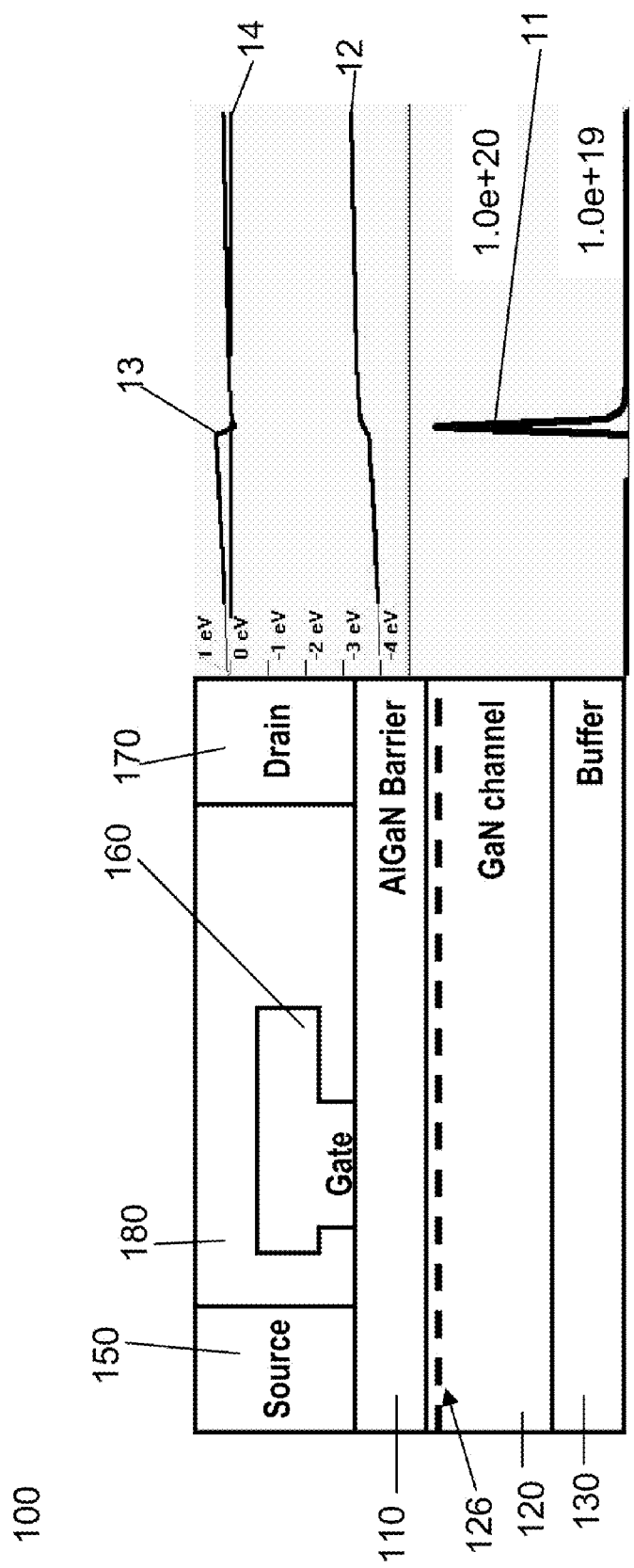
FIG. 1: Depletion mode AlGaN/GaN HFET structure, with continuous 2DEG between the source and drain contacts. The vertical energy band diagram of the device is also shown on the right, with the charge density plot below showing the concentration of the electrons in the 2DEG.
Figure 2:
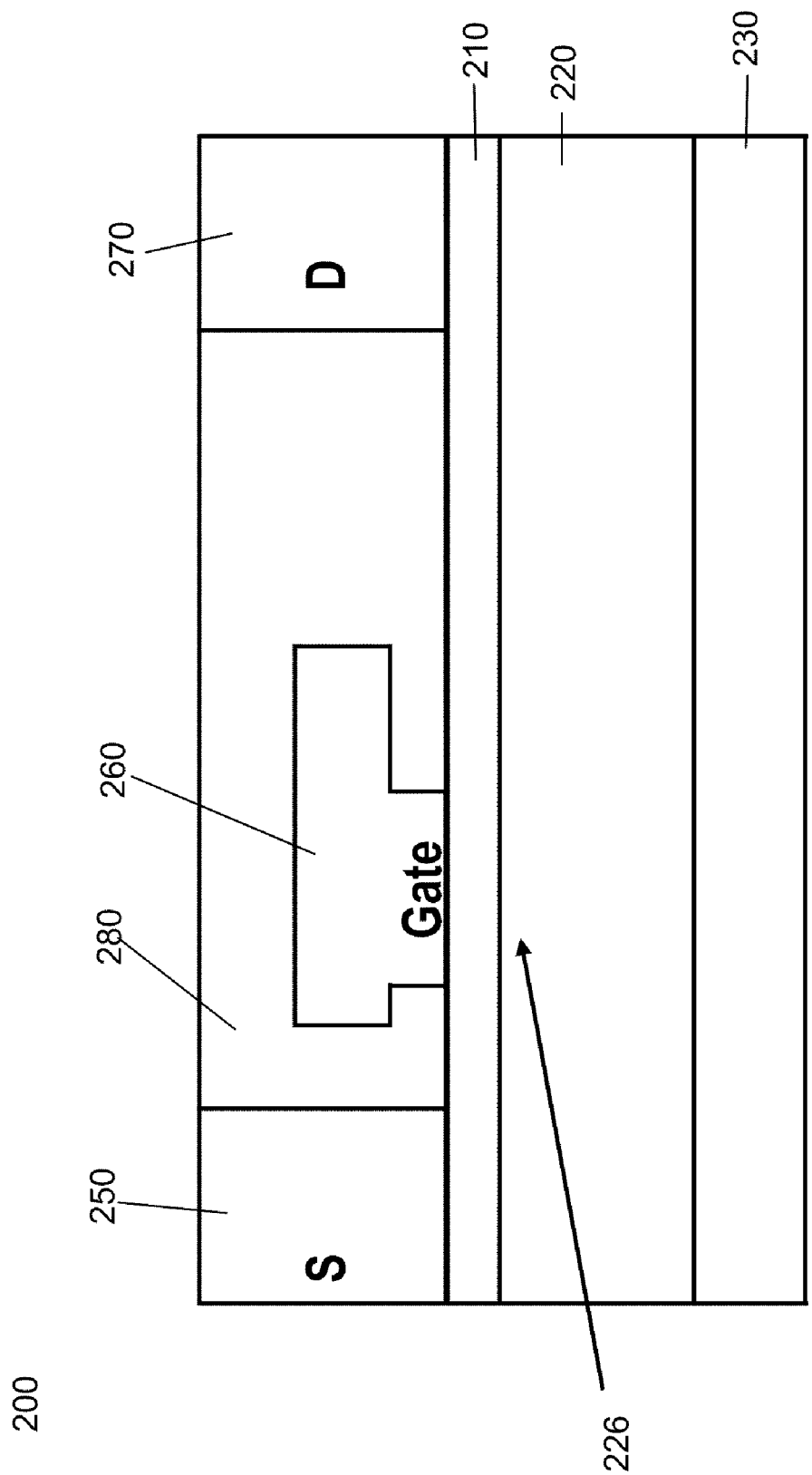
FIG. 2: Enhancement mode AlGaN/GaN HFET structure fabricated with a thin AlGaN barrier layer, resulting in no 2DEG.

Figures use consistent reference numbers in that the two least significant digits of a reference number refers to a component with the same description. For example, barrier layer 230 in FIG. 2 has the same description as barrier layer 130 in FIG. 1.

The following papers are incorporated by reference as though fully set forth herein:

[1] O. Ambacher, J. Smart, J. R. Shealy, N. G. Weimann, K. Chu, M. Murphy, W. J. Schaff, L. F. Eastman, R. Dimitrov, L. Wittmer, M. Stutzmann, W. Rieger, and J. Hilsenbeck, "Two-dimensional electron gases induced by spontaneous and piezoelectric polarization charges in N-And Ga-face AlGaN/GaN heterostructures," *Journal of Applied Physics*, vol. 85, pp. 3222-3233, 1999.

[2] M. A. Khan, Q. Chen, C. J. Sun, J. W. Yang, M. Blasingame, M. S. Shur, and H. Park, "Enhancement and depletion mode GaN/AlGaN heterostructure field effect transistors," *Applied Physics Letters*, vol. 68, pp. 514-516, 1996.

[3] Y. Cai, Y. Zhou, K. J. Chen, and K. M. Lau, "High-performance enhancement-mode AlGaN/GaN HEMTs using fluoride-based plasma treatment," *IEEE Electron Device Letters*, vol. 26, pp. 435-437, 2005.

[4] J. S. Moon, D. Wong, T. Hussain, M. Micovic, P. Deelman, M. Hu, M. Antcliffe, C. Ngo, P. Hashimoto, and L. McCray, "Submicron enhancement-mode AlGaN/GaN HEMTs," *Device Research Conference, 2002. 60th DRC. Conference Digest*, pp. 23-24 2002.

[5] A. Ludviksson, M. Xu, and R. M. Martin, "Atomic layer etching chemistry of Cl2 on GaAs (100)," *Surface Science*, vol. 277, pp. 282-300, 1992.

[6] D. Buttari, S. Heikman, S. Keller, and U. K. Mishra, "Digital Etching for Highly Reproducible Low Damage Gate Recessing on AlGaN/GaN HEMTs," in *Proceedings IEEE Lester Eastman Conference on High Performance Devices*, Newark, Del., 2002, pp. 461-469.

[7] D. Buttari, A. Chini, T. Palacios, R. Coffie, L. Shen, H. Xing, S. Heikman, L. McCarthy, A. Chakraborty, S. Keller, and U. K. Mishra, "Origin of etch delay time in Cl2 dry etching of AlGaN/GaN structures," *Applied Physics Letters*, vol. 83, pp. 4779-4781, 2003.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

A thin-grown AlGaN barrier layer is undesirable because of the inability to conduct from source to drain. Fluorine-treatment is undesirable because of non-uniformity, implant damage and reliability concerns. Therefore, gate recess etching is the most promising technique for fabricating enhancement mode HFET/HEMT devices, but the non-uniformity and plasma damage issues must be addressed. It would be ideal to have a self limiting etch process that would allow precise control over the etching, remove non-uniformity issues, and potentially minimize damage to the material. There are a few established methods for digital etching for GaAs [5], but very little work has been done for GaN. A digital etching technique has been presented that uses a dry plasma step and a wet etch step to remove 5-6A per step [6], but the drawback of this technique is that it could take more than 6 hours to remove 100A if the dry-wet processing steps took 20 minutes per cycle. Therefore, there has been no repeatable method for a semi-self-limiting etching process of GaN for improved uniformity in a short time period until now.

Figure 6:
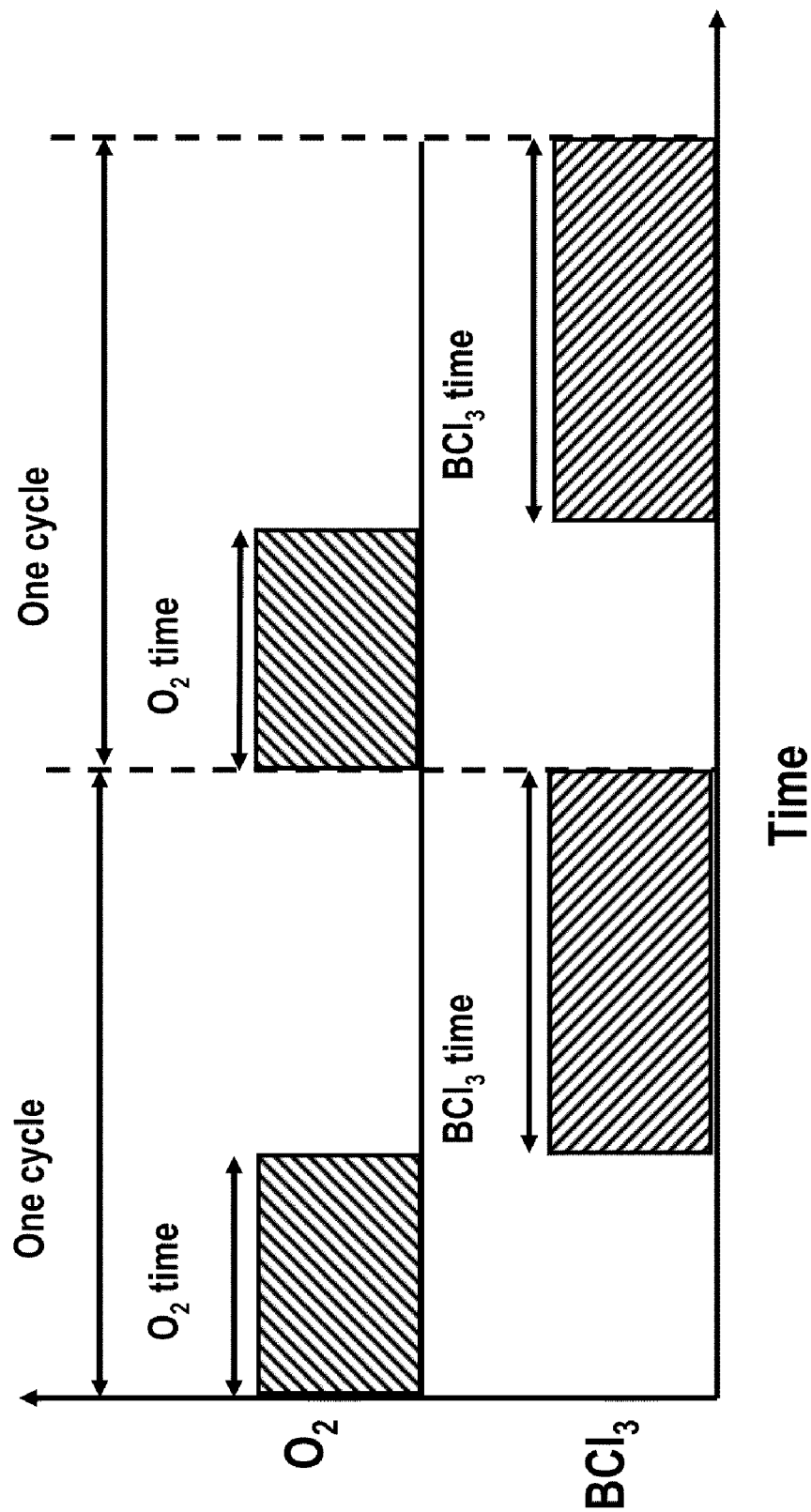
FIG. 6 Timeline of digital etching technique as described in this invention disclosure. For each cycle, an oxygen plasma is exposed to the AlGaN/GaN surface for an amount of time, followed by a $BCl_3$ plasma for a separate amount of time. The diagram shows two cycles of the process.

This disclosure describes a self-limiting, two-step etching technique that can be applied to AlGaN/GaN HFET structures for a more uniform, less damaging gate recess etch process for enhancement mode, or normally-off devices. It has been shown that a low-power oxygen plasma creates an oxidized layer on an AlGaN/GaN surface [6]. It has also been seen that this oxidized AlGaN/GaN layer has a self-limiting depth with time, but is linear with plasma power. However, this oxide layer is not easily removed with conventional $Cl_2$ plasma etching. On the other hand, it has been shown that a low-power $BCl_3$ plasma is very effective at removing the surface AlGaN/GaN oxide (better than $Cl_2$), but less effective at etching GaN than $Cl_2$ [7], which provides some selectivity for a semi-self-limiting etch process. By combining the AlGaN/GaN oxidation step with the $BCl_3$ oxide etch step, as shown in FIG. 6, a digital, or atomic layer etching (ALE) technique is created which can be used to remove angstroms of material for each cycle.

Figure 5:
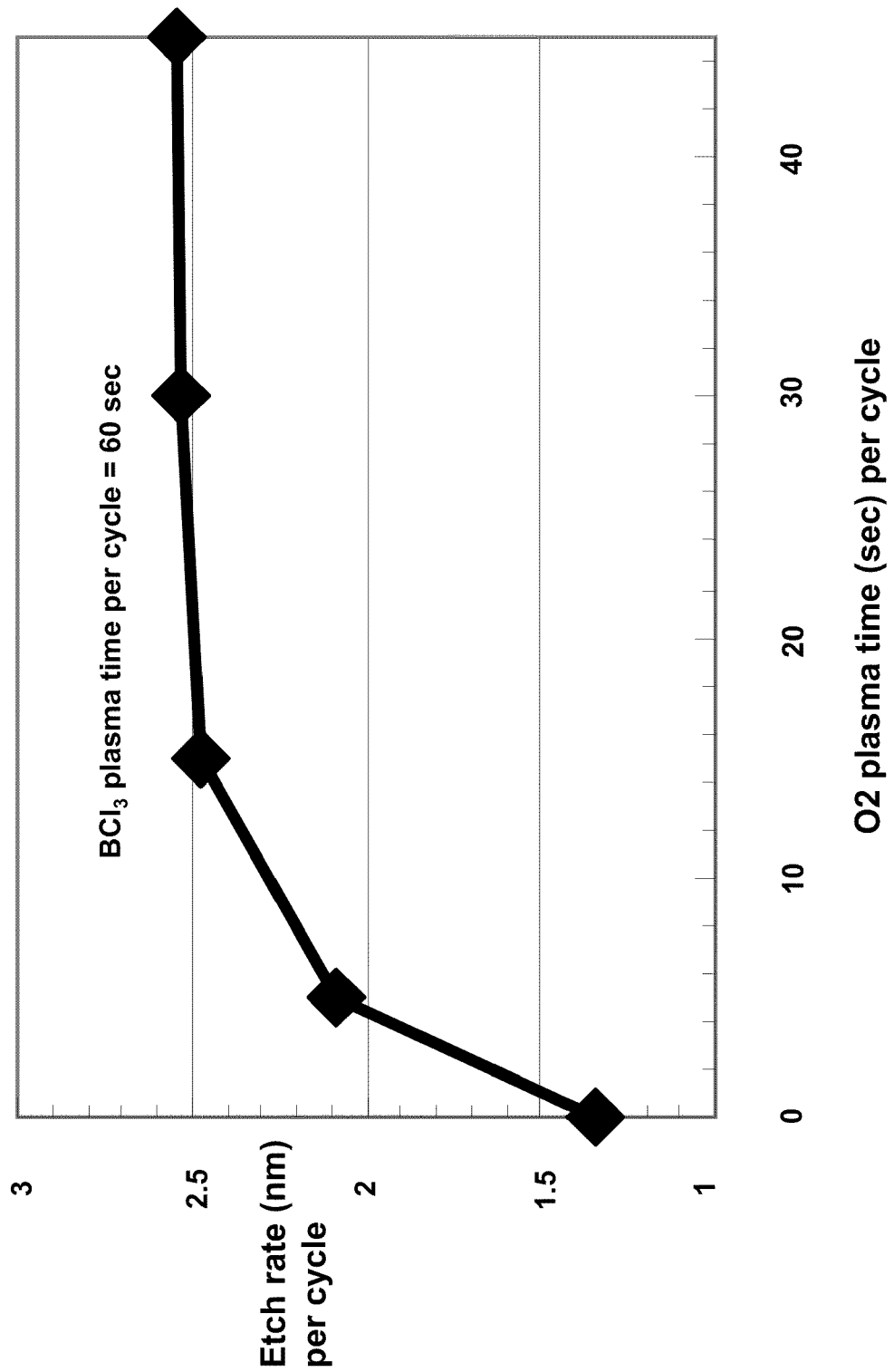
FIG. 5 Measured data of etch rate per cycle for a $BCl_3$ plasma time per cycle and varying oxygen plasma time per cycle.
Figure 7:
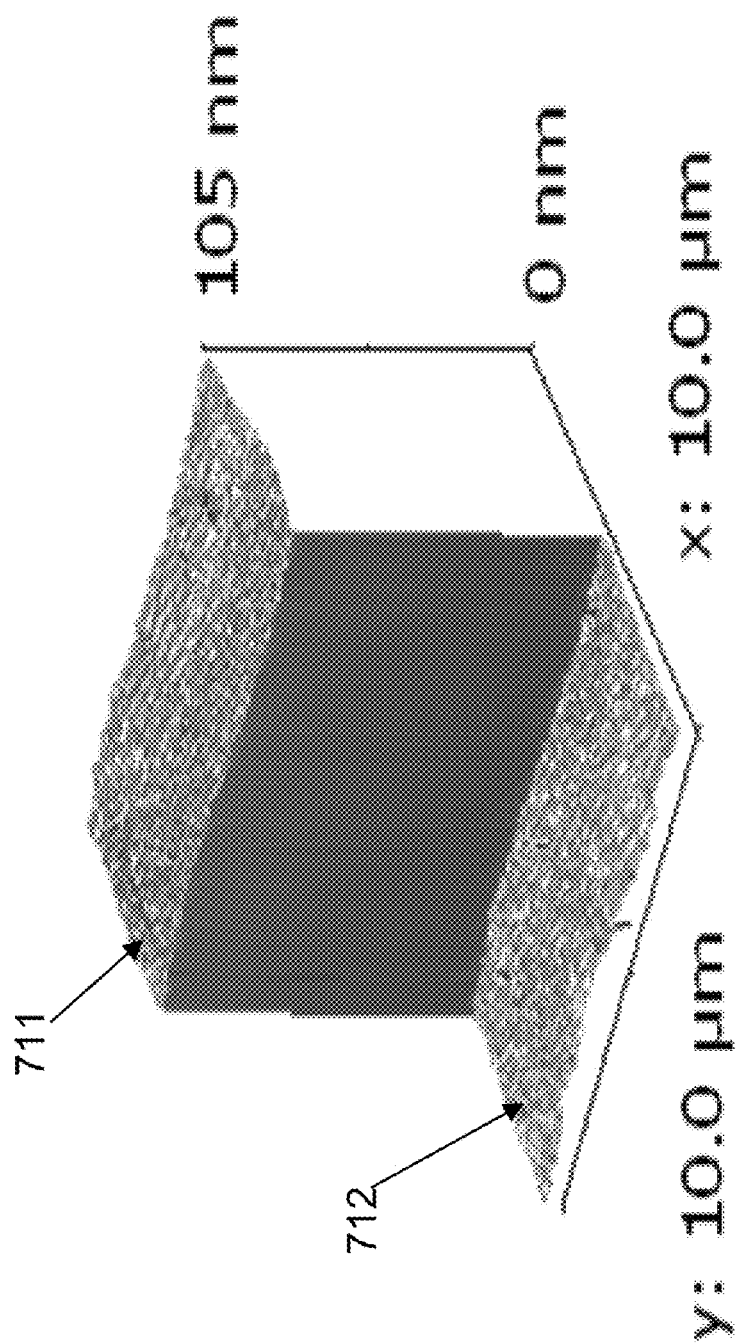
FIG. 7 Atomic Force Microscopy (AFM) image showing effects of two stage O2-$BCl_3$ plasma etching on surface roughness. The AFM image shows a step edge feature showing the surface remains smooth.

Pieces of GaN on Si masked with photoresist or SiN were processed in a RIE plasma etcher with oxygen and $BCl_3$. For the oxygen plasma step of the cycle, the oxygen flow rate was 45 sccm (standard cubic centimeters per second), the chamber pressure was 100 mTorr, the RIE power was 50 W, and the time was varied. For the $BCl_3$ plasma step of the cycle, the $BCl_3$ flow rate was 10 sccm, the chamber pressure was 10 mTorr, the RIE power was 15 W, and the time was fixed. GaN samples were etched the necessary number of cycles to result in approximately 100 nm of etched material. After removing the photoresist or SiN mask, the depth of the etch was measured using atomic force microscopy (AFM), and the etch rate was found by dividing the etch depth by the number of cycles. For a $BCl_3$ time of 60 sec per cycle, the data shown in FIG. 5 shows that the etch rate per cycle increases with oxygen plasma time per cycle up to 15 seconds of oxygen plasma per cycle. Above 15 seconds of oxygen plasma per cycle, the etch rate per cycle remains fairly constant at almost double the etch rate per cycle of no oxygen plasma per cycle. Therefore, for $BCl_3$ etch step conditions, this technique is shown to be a self-limiting etch process, which produces improved uniformity across a wafer compared to fluorine implantation treatment, or standard gate recess etching using a plasma etcher. Furthermore, since the $BCl_3$ etch step uses such a low power (15 W), and mostly etches only the oxidized layer, this process results in low damage to the remaining material. An AFM image of an etched sample is also shown in FIG. 7, which shows the roughness of the etched surface 712 is similar to the roughness of the unetched surface 711.

Figure 8:
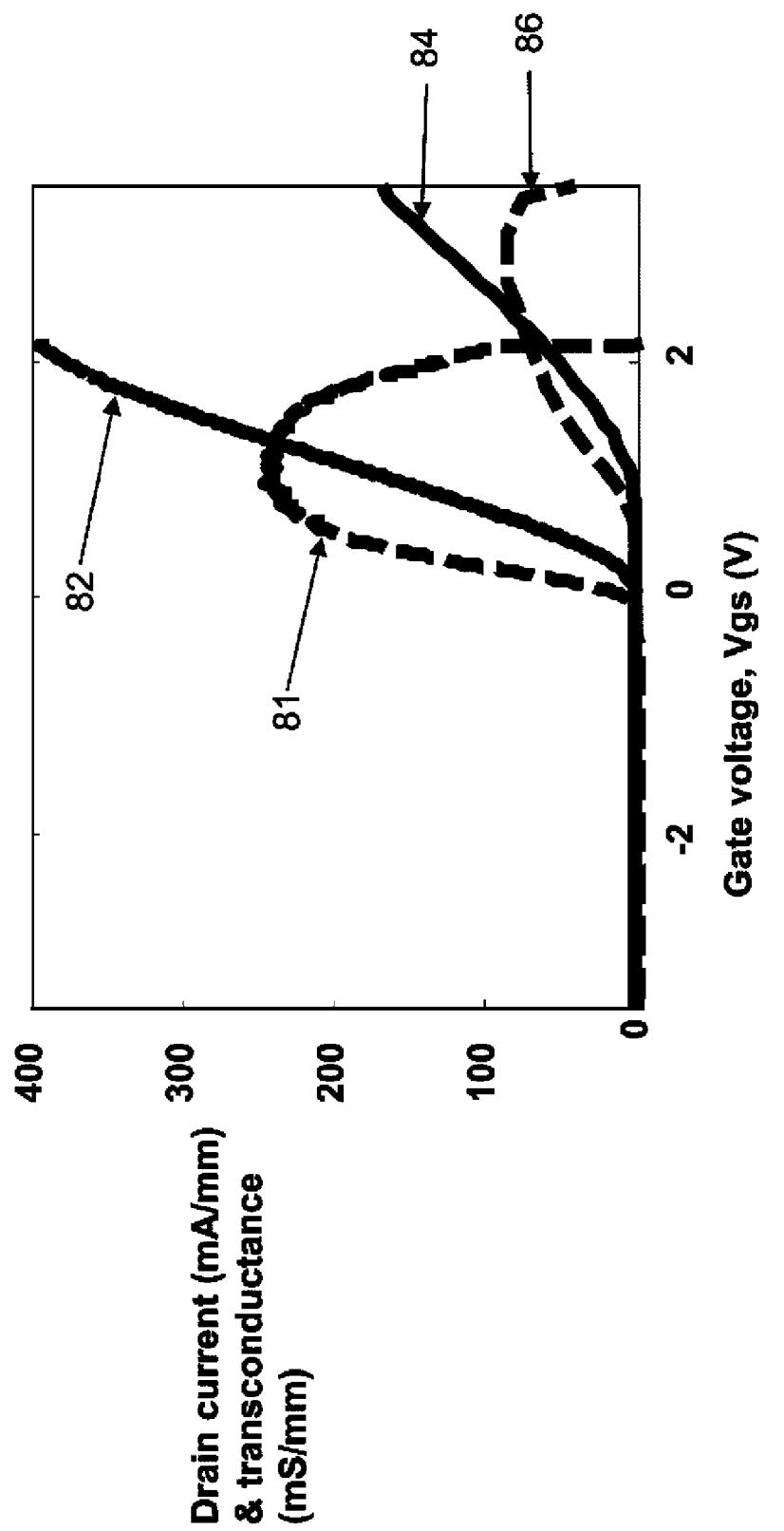
FIG. 8 Device characteristics of a standard fluorine-treatment enhancement mode device compared to a device processed using the ALE technique with oxygen and $BCl_3$, showing higher peak transconductance (gm) for the ALE-processed device.
Figure 9:
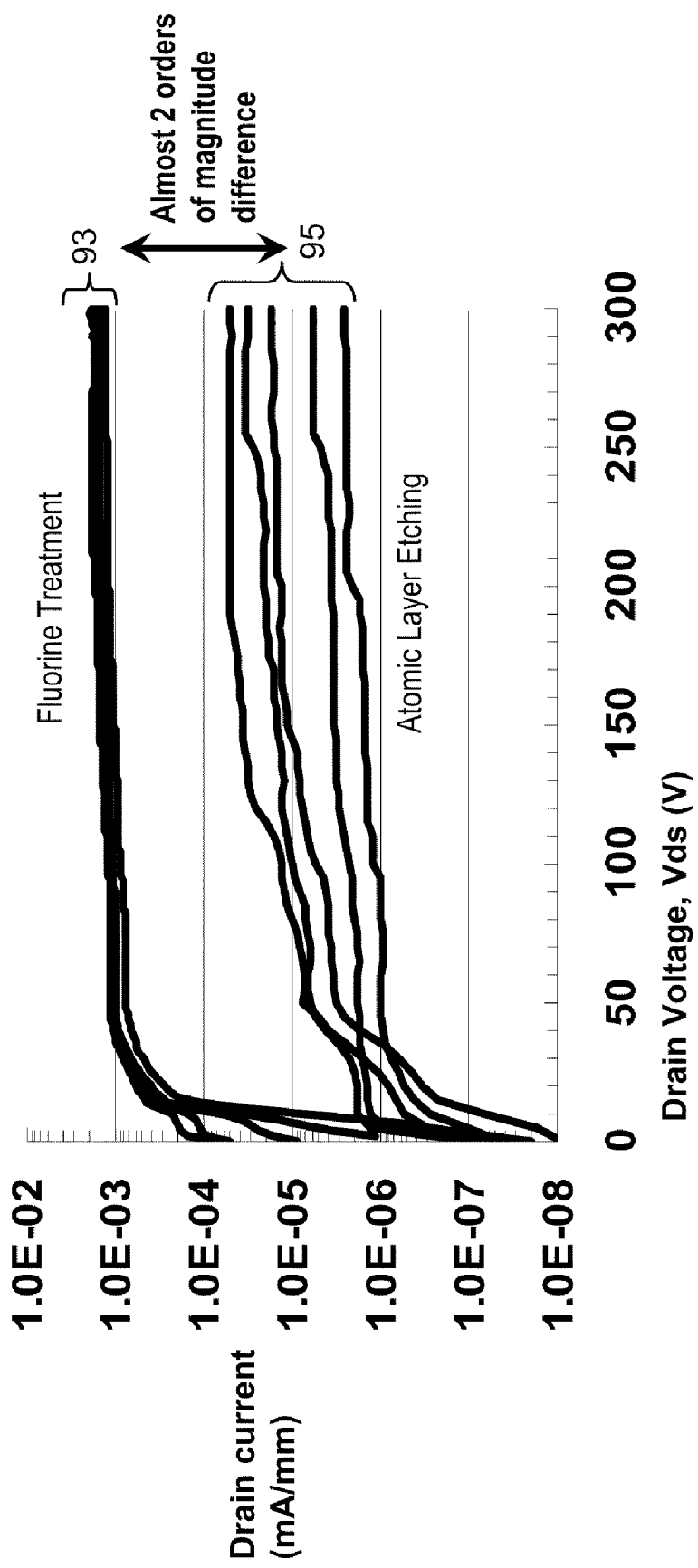
FIG. 9 Output characteristics of devices in the off-state (Vgs=−1V) showing the wafer processed with the ALE process has almost 2 orders of magnitude lower leakage current than the wafer processed with the standard fluorine-treatment.
Figure 12:
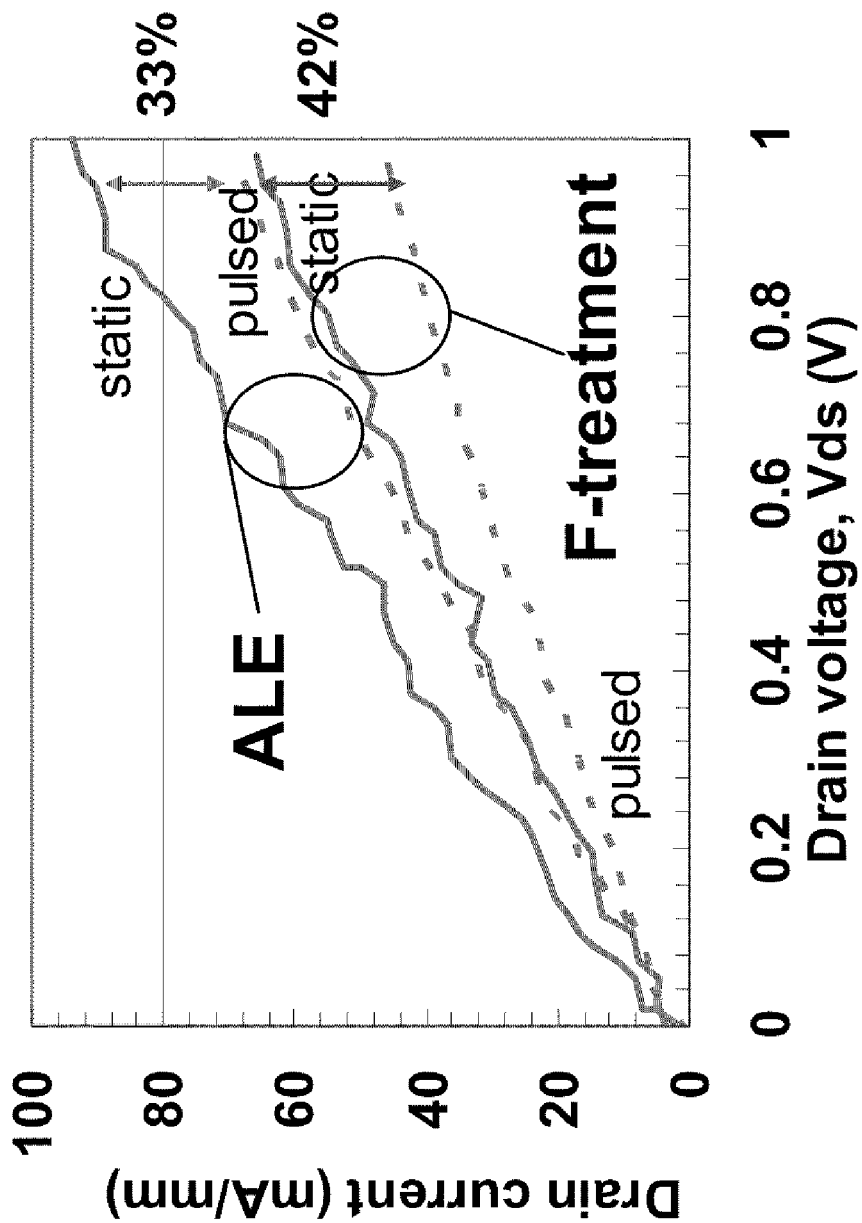
FIG. 12: Pulsed IV data comparing ALE-processed wafer with standard fluorine treatment wafer, showing ALE wafer has slightly lower current collapse.
Figure 13C:
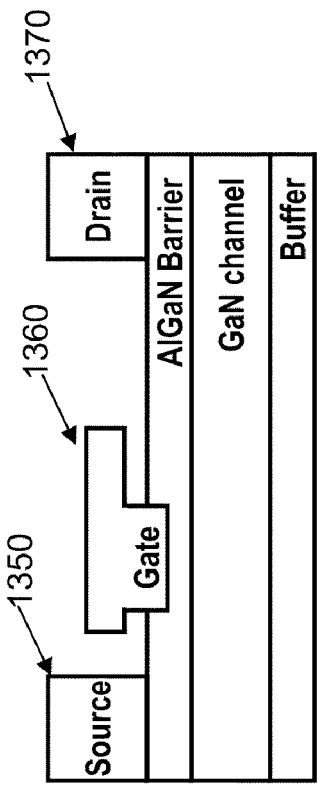
FIG. 13a-d Process flow for fabrication of enhancement mode GaN HFET with two stage $O_2$ $BCl_3$ plasma edging.
Figure 13D:
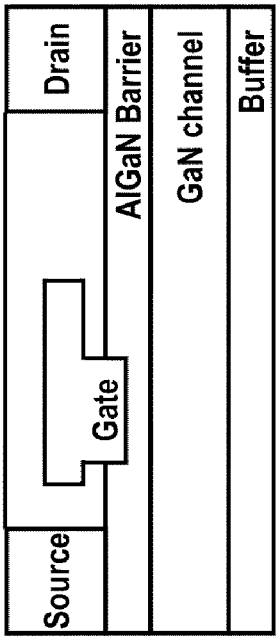
Figure 13A:
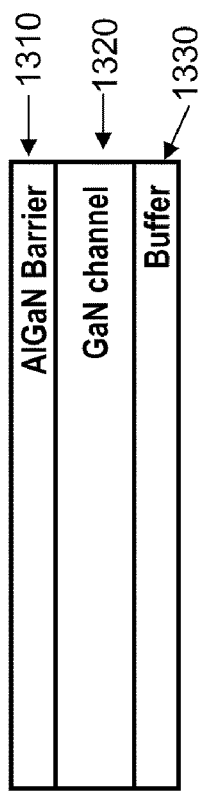
Figure 13B:
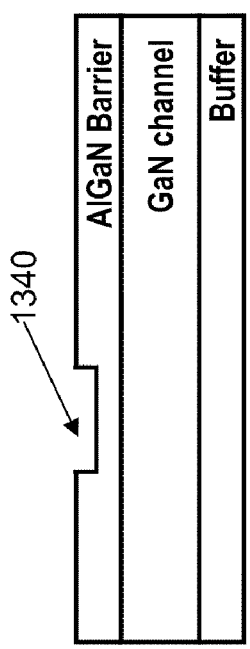

To show the advantages of the ALE process compared to the standard fluorine-treatment process, two GaN on Si wafers from the same chemical vapor deposition (CVD) growth were processed side-by-side using the same process steps except for the depletion-to-enhancement mode conversion step. Input characteristics of representative devices from each wafer are shown in FIG. 8. This data shows that the ALE-processed wafer has almost 3 times higher peak $g_m$ than the standard fluorine-treatment process (gm is the transconductance of the transistor). Transconductance is the derivative of the drain current with respect to the gate to source voltage. The characteristics of devices in the off-state (Vgs=−1V) from each of the two wafers are shown in FIG. 9. FIG. 9 shows that the leakage current (measured when the Gate to Source voltage is such that the device is biased in the off state) of the ALE-processed wafer is about 2 orders of magnitude lower than the standard fluorine-treatment devices, and the ALE data is more uniform than the fluorine-treatment data. Furthermore, pulsed IV data shown in FIG. 12 shows that the ALE-processed wafer has slightly better current collapse than the wafer with standard fluorine treatment.

Figure 3:
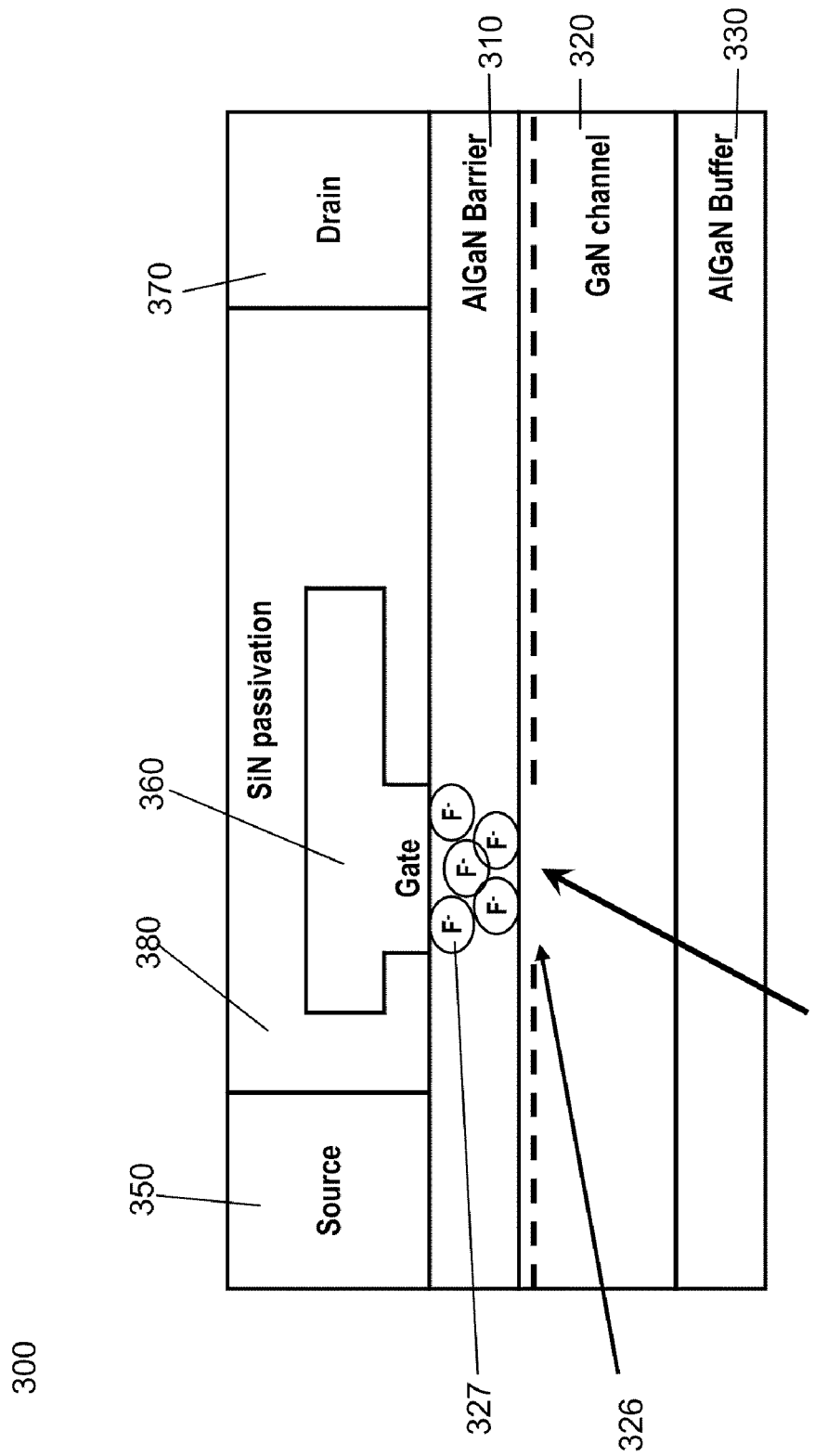
FIG. 3 Enhancement mode AlGaN/GaN HFET structure fabricated with implanted fluorine ions in the AlGaN barrier under the gate, which depletes the 2DEG under the gate, allowing the gate to modulate the channel but making the device normally-off.

FIG. 3 shows the cross section of a prior art enhancement mode HFET 300 fabricated using fluorine implantation to prevent the 2DEG under the gate region. The structure 300 is substantially the same as the structure 100 in FIG. 1 except fluorine ions 327 have been implanted in the barrier layer 310 below the gate 360. The result is an enhancement mode device because the break in the 2DEG 326 requires a positive gate source voltage above a threshold to supply the carriers needed for conduction.

Figure 4:
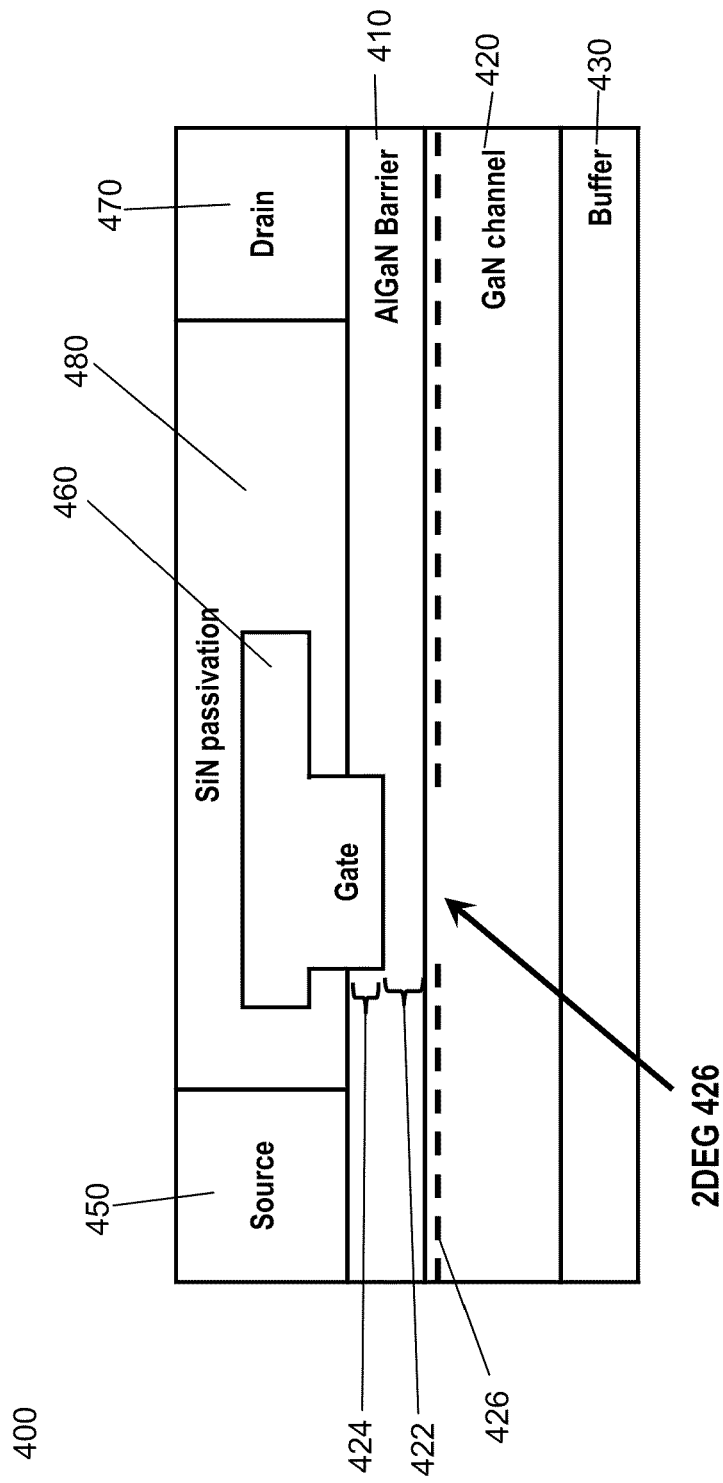
FIG. 4 Enhancement mode AlGaN/GaN HFET structure fabricated with a gate recess etch, which depletes the 2DEG under the gate much like the thin-grown AlGaN barrier structure, but only under the gate. Therefore, the excellent properties of the AlGaN/GaN 2DEG still exist everywhere but under the gate, and the gate is able to modulate the channel in that area.

FIG. 4 shows an embodiment 400 of the present invention comprising a buffer layer 430 which may be AlGaN, a GaN channel layer 420, an AlGaN barrier layer 410, a source 450, gate 460 and drain 470. The AlGaN barrier layer 410 is etched a distance 424 such that the remaining distance 422 between the Gate 460 and the GaN channel 420 is insufficient for the formation of the 2DEG 426, and the device 400 channel 420 has no continuous path at zero bias. This is shown by the 2DEG 426 absence under the gate 460 as a result of thinned barrier 410, which reduces polarization-induced charge. In a preferred embodiment, the distance 422 is approximately 10 nm. The thickness of the AlGaN barrier layer 410 is approximately 20 nm. The AlGaN layer 410 may range in thickness between 5 and 50 nm. The AlGaN thickness 422 under the gate 460 is generally half the thickness of the AlGaN barrier layer 410. A person skilled in the art will realize the thicknesses 422 and 424 used will depend on the concentration of aluminum in the AlGaN layer 410. Not shown in FIG. 4 is the substrate which may be silicon or silicon carbide. The buffer layer 430 is chosen such that it lattice matches the GaN layer 420. One such buffer 420 material is AlGaN with an appropriate concentration of aluminum.

FIG. 5 shows the etch rate per cycle of Oxygen and Boron trichloride. The Boron trichloride plasma etch time is substantially 60 seconds while the oxygen plasma oxidation time is varied. Note that beyond 15 seconds of oxygen plasma oxidation time, the etch rate per cycle does not substantially change. While the data in FIG. 5 is for calibrating the etch rate of GaN, AlGaN will etch substantially identically because the Aluminum does not prevent the oxidation or the etching by $BCl_3$. FIG. 5 shows etching 2.5 nm of GaN will take 20 seconds for the $O_2$ and 60 for the $BCl_3$ or 80 seconds. To etch 100 angstroms or 10 nm will take four cycles or 320 seconds.

FIG. 6 shows a preferred embodiment of the two phase plasma etch process. In the first stage the GaN is oxidized with oxygen at approximately 100 mTorr, approximately 45 sccm (standard cubic centimeters per minute) and approximately 50 watts. In the second stage the oxidized AlGaN layer is etched or removed with Boron trichloride plasma at approximately 10 mTorr, approximately 10 sccm and approximately 15 watts. Preferred Oxygen plasma oxidation times are greater than 15 to 20 seconds at 50 watts and 45 to 90 seconds for Boron trichloride plasma etching at 15 watts. A person skilled in the art will appreciate the oxidation rates and etch rates may vary with the plasma power.

FIG. 7 shows a sample of GaN etched according to the process of the present disclosure as shown by Atomic Force Microscopy. The surface 712 was etched according to embodiment of the present disclosure and the surface 711 was not. The surface roughness of 711 and 712 is substantially the same.

FIG. 8 shows the characteristics of an HFET device fabricated according to embodiment of the present disclosure and of a device fabricated using Fluorine implantation. The drain current 82 for the device fabricated according to an embodiment of the present disclosure has a greater slope than the device fabricated using the fluorine implantation process 84 as well as a greater value for a given gate-source voltage. This is also seen in the respective transconductance curves 81 and 86 where the transconductance 81 of the device fabricated according to an embodiment of the present invention has a greater slope and peak value than the transconductance curve 86 of the device fabricated using Fluorine implantation. The drain current is measured in units of milli amps per mm of gate width. In FIGS. 3 and 4 the gate width is normal to the figure. The transconductance is the derivative of the drain current with respect to the gate to source voltage.

FIG. 9 shows the drain current of a device fabricated according to an embodiment of the present invention (curves 95) and of a device fabricated using fluorine treatment (curves 93), when the gate to source voltage is minus one volt such that the device is off. The dispersion of the drain currents 95 fabricated with ALE is approximately 28 nanoamps/mm. For the Fluorine fabricated HFETs the dispersion in the drain currents 93 is approximately 2 microamps/mm. FIG. 9 shows an approximately two order of magnitude decrease in leakage current, from 2E-6 to 2.8E-8 amps/mm.

Figure 10:
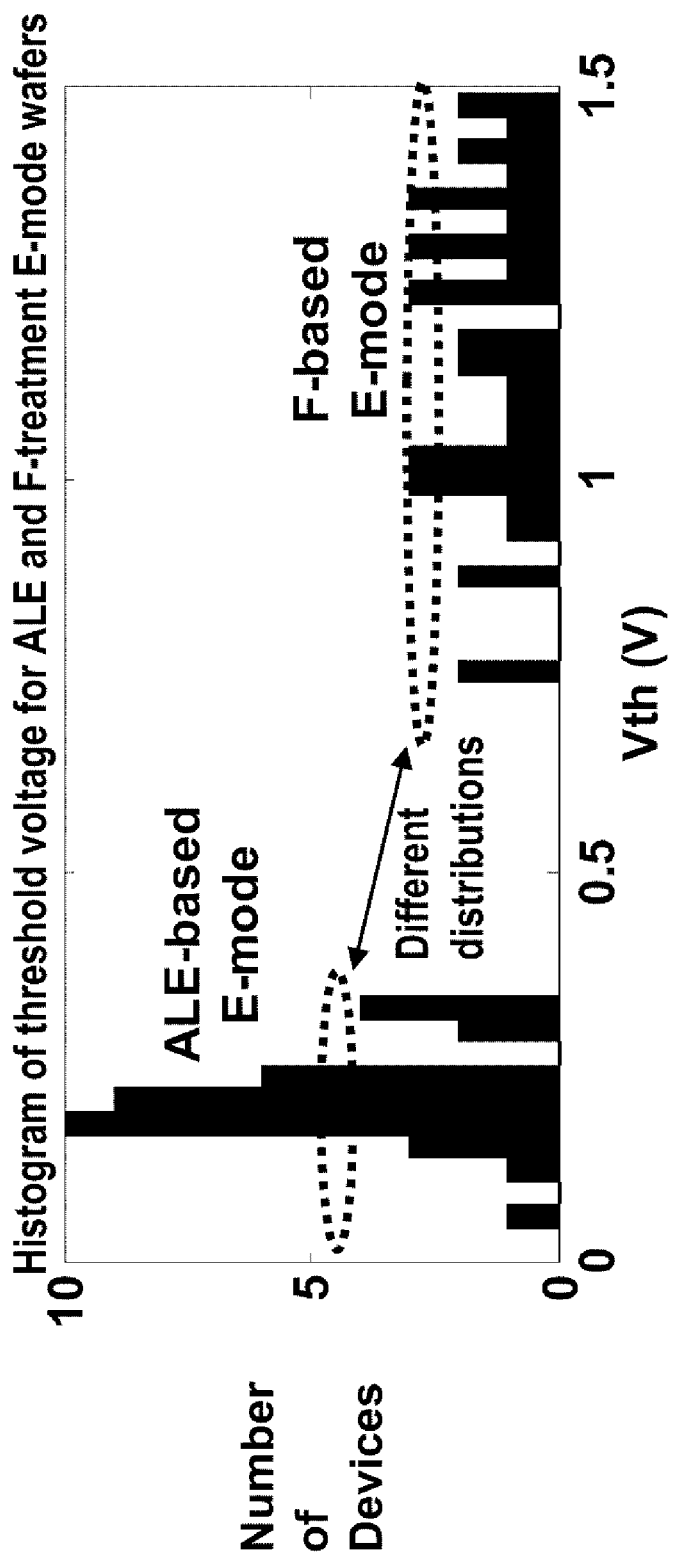
FIG. 10 Histogram of threshold voltage distribution for the ALE-processed devices and fluorine-processed devices showing a narrower distribution of threshold voltage (i.e. more uniform) for the ALE-processed devices.

FIG. 10 shows a measure of the uniformity of the ALE fabricated HFETs and the fluorine fabricated HFETs in terms of the threshold voltages. A smaller standard deviation is preferred since it allows for more predictable device performance. FIG. 10 shows a histogram of threshold voltage distribution for devices from the ALE-processed wafer along with devices from the fluorine-treatment wafer. The histogram shows that the ALE process has a narrower threshold voltage distribution compared to the standard fluorine-treatment wafer, meaning that the ALE process results in more uniform threshold voltages compared to the fluorine-treatment method. The ALE processed Enhancement mode HFETs have a median threshold voltage of 0.2 volts with a standard deviation of 0.063 volts. The median threshold voltage for the HFETs produced with the Fluorine process is 1.17 volts with a standard deviation of 0.2 volts. The value of the device threshold voltage is dependent on the thickness of the thinned ALGaN barrier below the gate.

Figure 11:
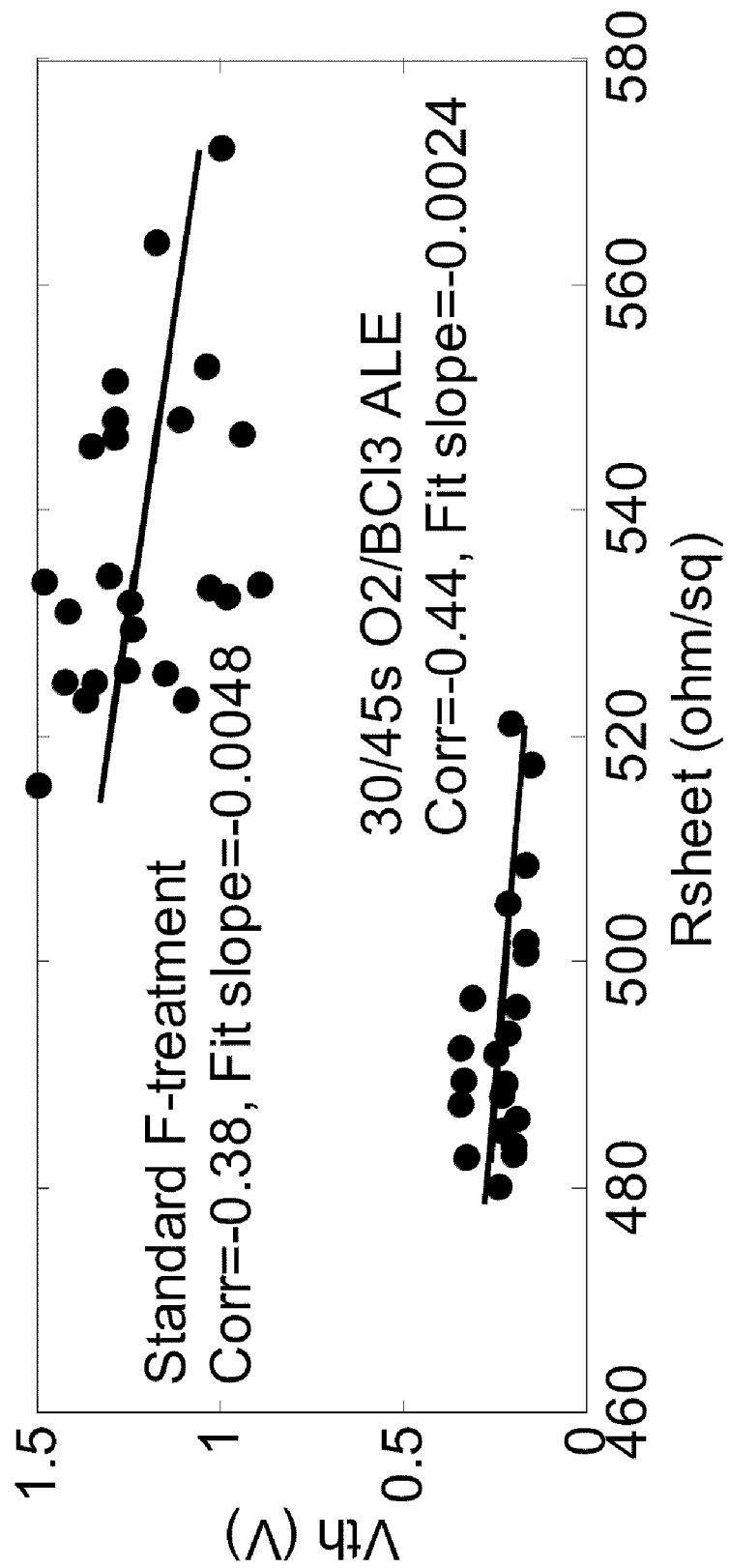
FIG. 11 Correlation between threshold voltage and sheet resistance for ALE-processed wafer compared to the standard-fluorine-treatment wafer.

FIG. 11 shows the correlation between the threshold voltage and the sheet resistance for the two devices, showing the narrower distribution of device characteristics for the ALE fabricated device. The correlation coefficient "con" indicates the spread of the data around the best fit straight line. Ideally "con" is one. The "Fit Slope" is the slope of the best fit line to the data and has units of volts/ohm/sq. As can be seen from FIG. 11, devices fabricated according to an embodiment of the present invention have a lower sheet resistance and threshold voltage than those fabricated using Fluorine implantation.

FIG. 12 shows pulsed IV data comparing ALE-processed wafer with standard fluorine treatment wafer, showing ALE wafer has slightly lower current collapse. Current collapse is the difference in drain current measured with a static drain-source voltage versus a pulsed drain-source voltage. In the pulsed drain-source voltage the drain-source voltage is decreased from a quiescent bias point to the value used in a static measurement for a time short enough that current transients persist. Current collapse is a measure of the bandwidth of the device. The greater the current collapse, the lower the bandwidth. In addition, the drain current versus the drain-source voltage for a device is lower, the transconductance of the device is lower, and the on resistance is higher for a device operating with a dynamic drain-source and gate-source voltage.

FIGS. 13a through 13d illustrate a preferred embodiment for fabricating an enhancement mode HFET in GaN. In the first step a lattice matching buffer layer 1330 is placed by methods known in the art on a substrate (not shown). The substrate may be silicon or silicon carbide or other material compatible with the lattice matching buffer layer. On top of lattice matching buffer layer 1330 a GaN layer 1320 is fabricated such that the GaN layer is Ga Polar towards the AlGaN barrier layer 1310. A barrier layer 1310 of AlGaN is then formed. Next a gate recess 1340 is fabricated by masking of the gate region then using a two step plasma etching process to etch the AlGaN such that a desired thickness of AlGaN remains between the gate and the GaN channel layer 1320. The device is further fabricated by standard techniques, as shown in FIG. 30c, by fabricating a gate 1360, source 1350 and drain 1370 on the device. The source and drain are connected to the GaN channel 1320 by known techniques such as annealing or etching the ohmic contacts. Finally, the device is passivated using know techniques by adding a passivation coating 1380.

What is claimed is:

1. A method of fabricating an Enhancement mode Heterojunction Field Effect Transistor (HFET) device, the method comprising: receiving a device substantially comprising a depletion mode HFET wherein a barrier layer and channel layer of the HFET comprise Gallium Nitride (GaN) and Aluminum Gallium Nitride (AlGaN) respectively;
   forming an enhancement mode gate region in the depletion mode HFET by repeated cycles of;
   a) forming oxidized AlGaN in the gate region of the barrier layer in the depletion mode HFET with Oxygen (O2) plasma for a first time; then
   b) etching the oxidized AlGaN in the depletion mode HFET with Boron Trichloride (BCl3) for a second time.

2. The method of claim 1 wherein the first time is between 0 and 45 seconds and the second time is between 45 and 90 seconds.

3. The method of claim 2 wherein the first time is between 15 and 20 seconds and the second time is substantially 60 seconds.

4. The method of claim 1 wherein the oxidizing with Oxygen plasma is at substantially 50 watts and the etching with Boron Trichloride is at substantially 15 watts.

5. The method of claim 1 wherein the HFET is a High Electron Mobility Transistor device.

6. A method of fabricating an Enhancement mode HFET device, the method comprising:
   receiving a device substantially comprising a depletion mode HFET;
   forming an enhancement mode gate region in the depletion mode HFET by repeated cycles of thinning a gate region in increments of 1.2 to 2.5 nanometers.

7. A method of fabricating an enhancement mode semiconductor active device, comprising the steps of:
   a) receiving a vertically inhomogeneous III-Nitride semiconductor structure comprising a barrier layer disposed on a channel layer and wherein the channel layer exhibits a two-dimensional electron gas;
   b) introducing oxygen (O2) plasma into an exposed region of the barrier layer to form an oxide layer;
   c) introducing boron trichloride (BCl3) plasma into the exposed region to etch the formed oxide layer;
   d) repeating steps b and c to cause the channel layer to be depleted of charge carriers in the exposed region;
   e) completing the formation of the said active device through the formation of source, drain and gate contacts;
   wherein the said action (d) causes the said active device to have a positive threshold voltage.

8. The method of claim 7, wherein said semiconductor structure is an AlGaN/GaN high electron mobility transistor structure.

9. The method of claim 7, wherein the said semiconductor structure is supported by a substrate of, silicon or silicon carbide.

10. The method of claim 7, wherein the exposed region of the barrier layer is subjected to oxygen and boron trichloride plasmas using feed gases of O2 and BCl3, respectively.

* * * * *